United States Patent [19]
Lai et al.

[11] Patent Number: 5,980,295
[45] Date of Patent: Nov. 9, 1999

[54] ELECTRICAL CONNECTOR WITH A BOARD RETAINING MEANS

[75] Inventors: Ching-Ho Lai, Tao-Yuan Hsien; Warren Pei, Taipei, both of Taiwan

[73] Assignee: Hon Hai Precision Ind. Co., Ltd., Taipei Hsien, Taiwan

[21] Appl. No.: 08/918,054

[22] Filed: Aug. 25, 1997

[30] Foreign Application Priority Data

Oct. 18, 1996 [TW] Taiwan ................................. 85216150

[51] Int. Cl.[6] .................................................. H01R 13/62
[52] U.S. Cl. .......................................................... 439/327
[58] Field of Search ................................... 439/325, 326, 439/327, 328

[56] References Cited

U.S. PATENT DOCUMENTS 5,234,354  8/1993  Smart ........................................ 439/326
5,484,302  1/1996  Yamada et al. ...................... 439/328 X

*Primary Examiner*—Khiem Nguyen

[57] ABSTRACT

An electrical connector for reliably and electrically connecting a daughter board and a mother board, includes a first housing (10), a second housing (20) and a pair of board retaining means (30) wherein said second housing (20) is integrally formed with two opposed supporting portions (21, 22) which each further has a pair of spaced guiding rails (211, 221) for respectively guiding and clamping two opposed edges of the daughter board (40). A cavity portion (23, 24) is defined with a horizontal cavity (231, 241) and a vertical cavity (232, 242). Each board retaining means (30) is defined with an acting portion (31), a first resilient portion (32), a latching portion (33), a second resilient portion (34) and a retentive portion (35) for efficiently locking the inserted daughter board to maintain a reliably electrical contact between the daughter board and the electrical connector.

19 Claims, 11 Drawing Sheets

5,980,295

ELECTRICAL CONNECTOR WITH A BOARD RETAINING MEANS

BACKGROUND OF THE INVENTION

1. Field of The Invention

The invention relates to an electrical connector for electrically connecting a daughter board and a mother board, and particularly to an electrical connector having a board retaining means for reliably and releasably latching an inserted daughter board.

2. The Prior Art

As known, for raising or increasing some requested functions, most of computer systems with mother boards provide a plurality of specific electrical connectors to receive different daughter boards, as generally called "the extensive cards", having some electrical apparatus or chips thereon. Such electrical connector mainly forms an elongated slot having a plurality of contacts for electrically receiving the corresponding daughter board therein, and is further deposited with a pair of board retaining means at opposed ends thereof for latching the daughter board. The designs regarding such electrical connectors with a board retaining means can be referred to U.S. Pat. Nos. 3,993,390, 4,057,879, 4,832,617, 4,986,765, 5,286,217, 5,372,518 and 5,383,792, and Taiwan Patent Application Nos. 78,102,902, 79,211,470, 80,200,008, 80,110,023 and 82,217,323.

However, the conventional board retaining means merely accommodates a light daughter board which is just mounted with some micro-chips thereon. When another type daughter board mounted with some heavy electrical apparatus like a CPU (Central Process Unit) and a micro-fan for dissipation heat, is installed in the conventional electrical connector, the inserted daughter board may lean toward one side of the connector to result in a poorly electrical contact between the connector and the daughter board, due to a center of gravity of the board daughter board being unstable. If such connector receiving the heavy daughter board is further located in a vibrating environment, said poor contact condition may be worsened.

Accordingly, for resolving the above disadvantages, an object of the invention is to provide an improved electrical connector which mainly includes a first housing, a second housing and a board retaining means for providing a fine retentive effect with respect to an inserted daughter board, especially to a heavy daughter board, and for maintaining a reliably electrical contact. The first housing forms an elongated slot therein for receiving a daughter board. The second housing is designed with a pair of supporting portions each having a cavity portion for installation with a corresponding board retaining means, and having two opposed guiding rails for clamping and guiding the insertion of the daughter board with regard to the first housing. The board retaining means is defined with an acting portion, a first resilient portion, a latching portion, a second resilient portion and a retentive portion.

SUMMARY OF THE INVENTION

According to an aspect of the invention, an electrical connector for electrically connecting a daughter board and a mother board, includes a first housing, a second housing and a pair of board retaining means wherein said second housing is integrally formed with two opposed supporting portions which each further has a pair of spaced guiding rails for respectively guiding and clamping two opposed edges of the daughter board. A cavity portion is defined with a horizontal cavity and a vertical cavity. Each board retaining means is defined with an acting portion, a first resilient portion, a latching portion, a second resilient portion and a retentive portion for efficiently locking the inserted daughter board to maintain a reliably electrical contact between the daughter board and the electrical connector.

DETAILED DESCRIPTION OF THE PREFERRED EMBODIMENTS

Figure 1:
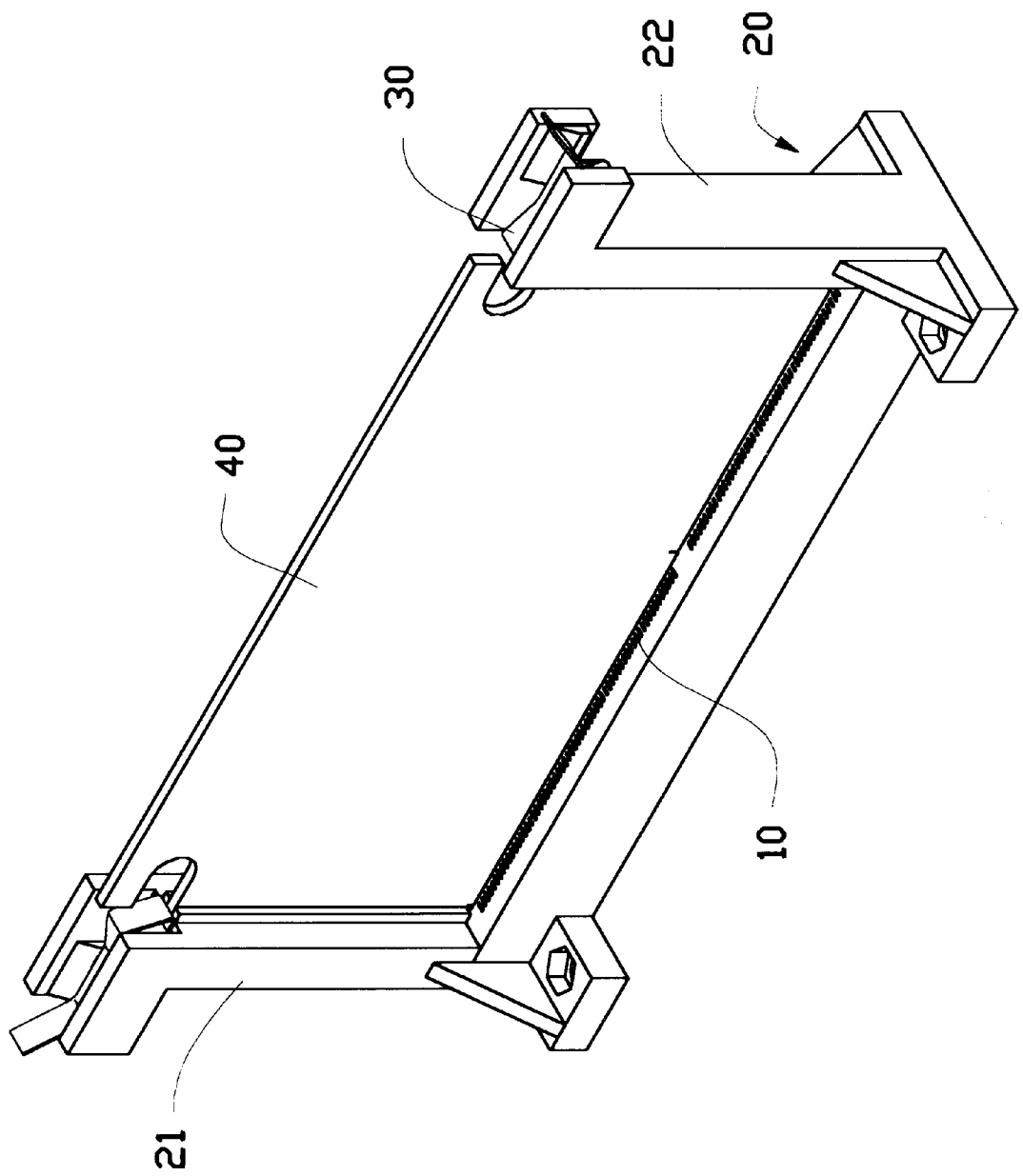
FIG. 1 is a perspective view of the electrical connector of first embodiment according to the present invention.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. A first embodiment of the present invention will now be shown with reference to FIGS. 1–9. The first embodiment of the present invention as shown in FIGS. 1 & 2 is an electrical connector system which mainly consists of a first housing (10), a second housing (20) and a pair of board retaining means (30).

Figure 2:
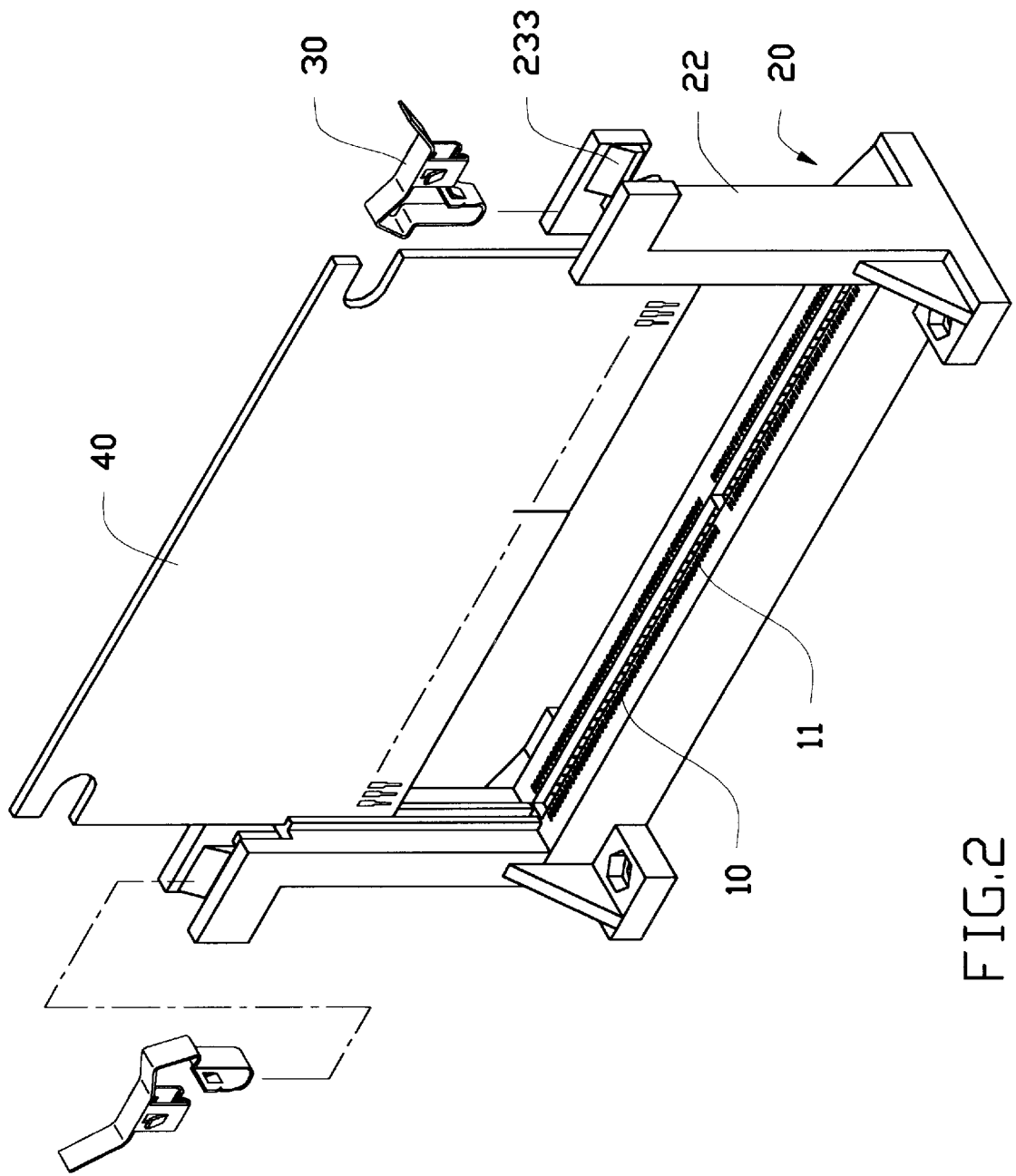
FIG. 2 is an exploded perspective view of the electrical connector according to FIG. 1.
Figure 3:
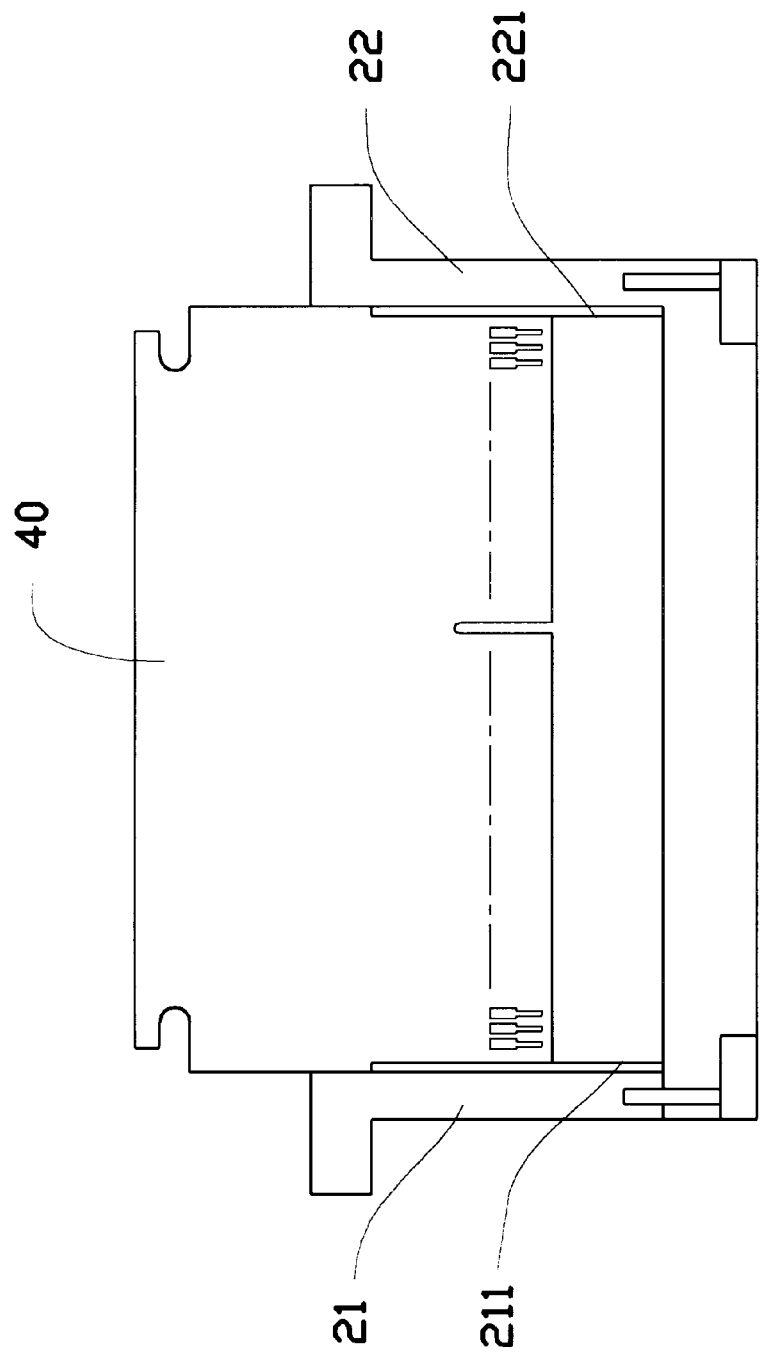
FIG. 3 is a front view of the electrical connector according to FIG. 1, wherein the board retaining means are withdrew from the connector.

As shown in FIGS. 1–3, the first housing (10) forms an elongated slot (11) having a plurality of contacts (not shown) for receiving an inserted daughter board (40) to electrically connect the daughter board (40) and a mother board (not shown). The second housing (20) is integrally formed with two vertical opposed supporting portions (21, 22) located on opposed ends of said first housing (10). The supporting portions (21, 22) each includes two spaced guiding rails (211, 221) which extend vertically along the supporting portions (21, 22) and horizontally toward said slot (11), for respectively guiding and clamping two opposed edges of the daughter board (40).

Figure 4:
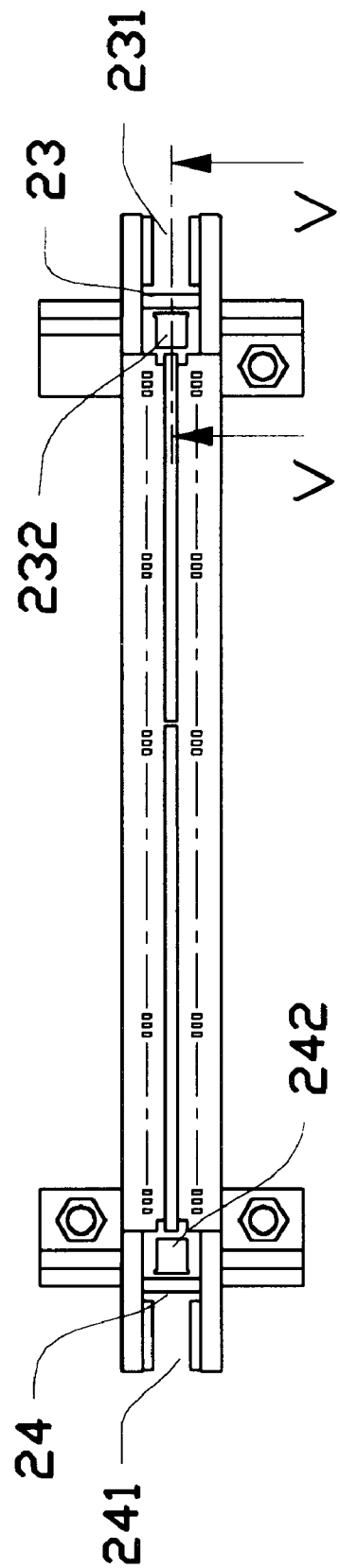
FIG. 4 is a top view of the electrical connector according to FIG. 3.
Figure 5:
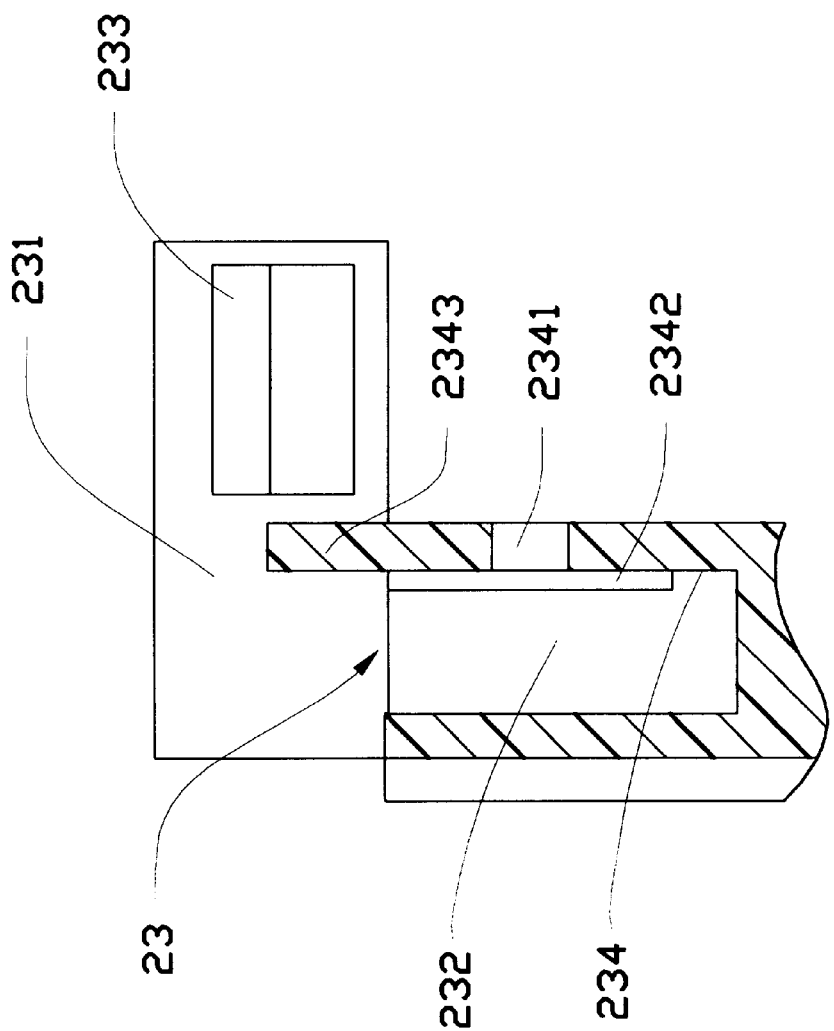
FIG. 5 is an enlarged partially cross-sectional view taken along line V—V of FIG. 4.

As shown in FIGS. 4–5, two cavity portions (23, 24) are formed above said supporting portions (21, 22). The cavity portion (23) as being a simple is defined with a horizontal cavity (231) and a vertical cavity (232). Additionally, as shown in FIG. 5, both of the cavities (231, 232) communicate with each other in an end thereof. Two opposed sides defining each horizontal cavity (231), are respectively arranged with a protrusion (233) having an incline (no labeled) as shown in FIG. 2. The vertical cavity (232) includes a hole (2341) formed in an inner wall (234) thereof, and a pair of interfering recesses (2342) respectively formed on two opposed sides of said inner wall (234). A stop section (2343) extends upward from the inner wall (234) of the vertical cavity (232) to enter the horizontal cavity (231), for preventing the resilient board retaining means from being permanently deformed.

Figure 6:
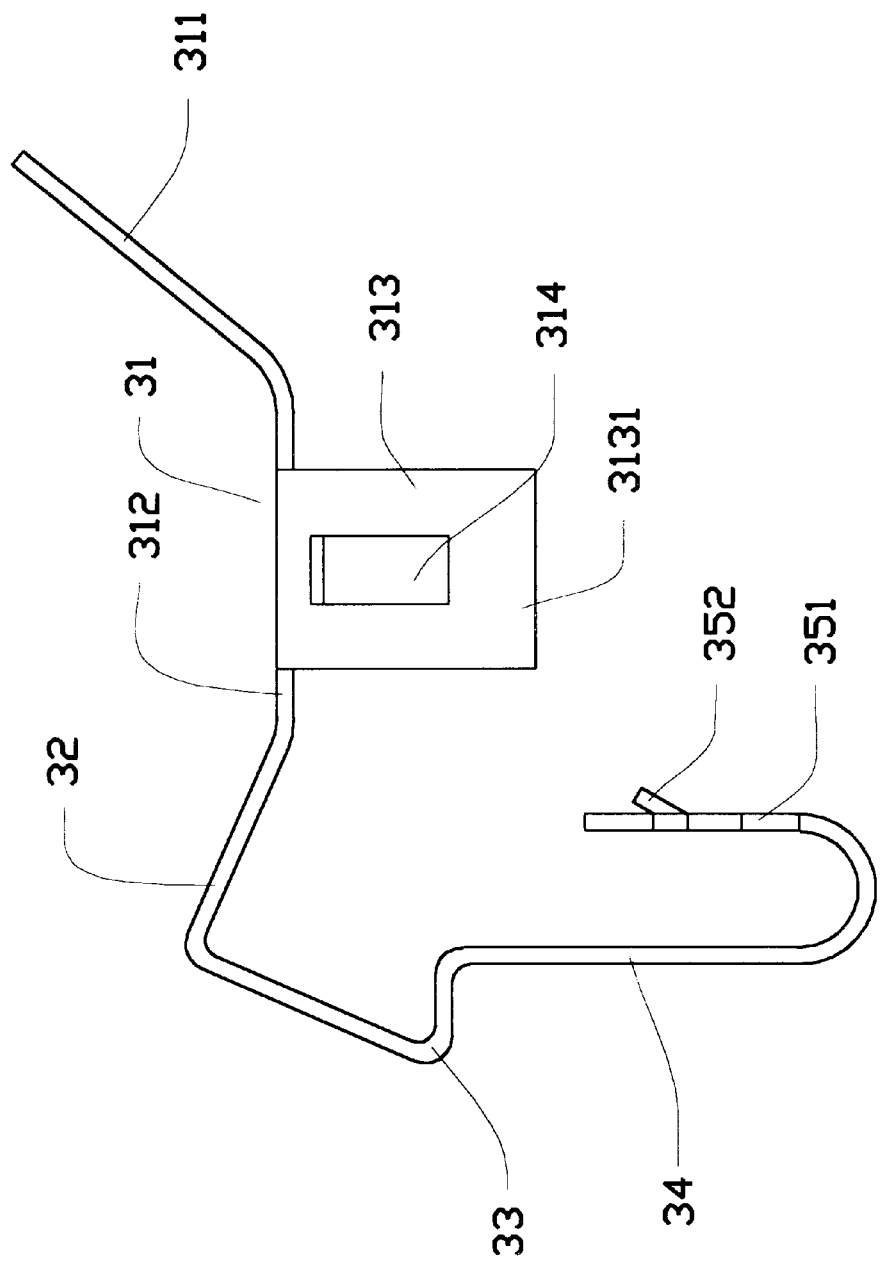
FIG. 6 is an enlarged side view of a board retaining means according to FIG. 2.
Figure 7:
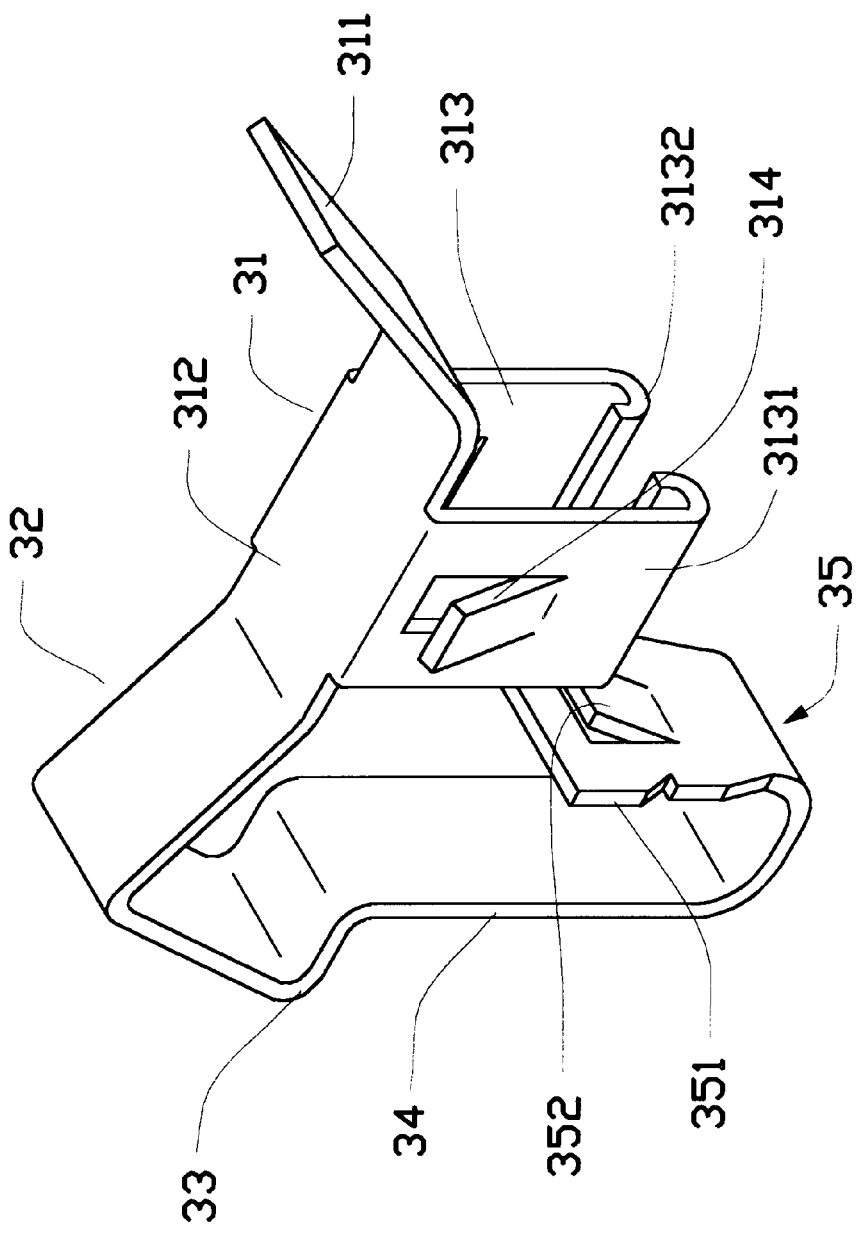
FIG. 7 is a enlarged perspective view of the board retaining means.

The board retaining means (30) as shown in FIGS. 6 & 7, is made of a resilient metal sheet by means of stamping and bending processes. The board retaining means (30) is defined with an acting portion (31), a first resilient portion (32), a latching portion (33), a second resilient portion (34) and a retentive portion (35). The acting portion (31) includes an operative section (311) for providing an user with a manual operation, and an extensive section (312) which forms two tabs (313) on two opposed edges thereof for providing the user with another manual operation (the detail regarding these manual operations will be described later). Each tab (313) further provides a hook-like first orienting section (314) extending outward for tightly abutting against the protrusion (233) in the horizontal cavity (231) to achieve a close engagement between the protrusions (233) and the tabs (313). As shown in FIG. 7, a buffer section (3132) is formed on a free end (3131) of each tab (313) wherein said buffer sections (3132) of both tabs (313) oppositely extend toward each other. Each buffer section (3132) is configured as a bent end, for preventing the tabs (313) from being oppositely compressed too much by the manual operation.

The first resilient portion (32) is integrally formed with said the extensive section (312) of the acting portion (31), and is configured with an angularly bent cantilever for providing the manual operation with a required resilience. The latching portion (33) integrally connected with said first resilient portion (32), has an angular bent structure which is expended into a space above the elongated slot (11), for latching a corresponding notch of the daughter board (40) as shown in FIGS. 1–3. Similar to the first resilient portion (32), the second resilient portion (34) positioned below said latching portion (33), is also adapted to provide the movement of the acting portion (31) with a required resilience.

The blade-like retentive portion (35) opposite to the second resilient portion (34), mainly includes a pair of barbs (351) and a hook-like second orienting section (352) therein wherein the barbs (351) are respectively located on opposed edges of the retentive portion (35) for retentively cooperation with the interfering recesses (2342) of the vertical cavity (232) of the second housing (20). The second orienting section (352) for retentively cooperation with said hole (2341) in the vertical cavity (232), can be adapted to enhance the retentive effect between the cavity portion (23) and the board retaining means (30).

Figure 8:
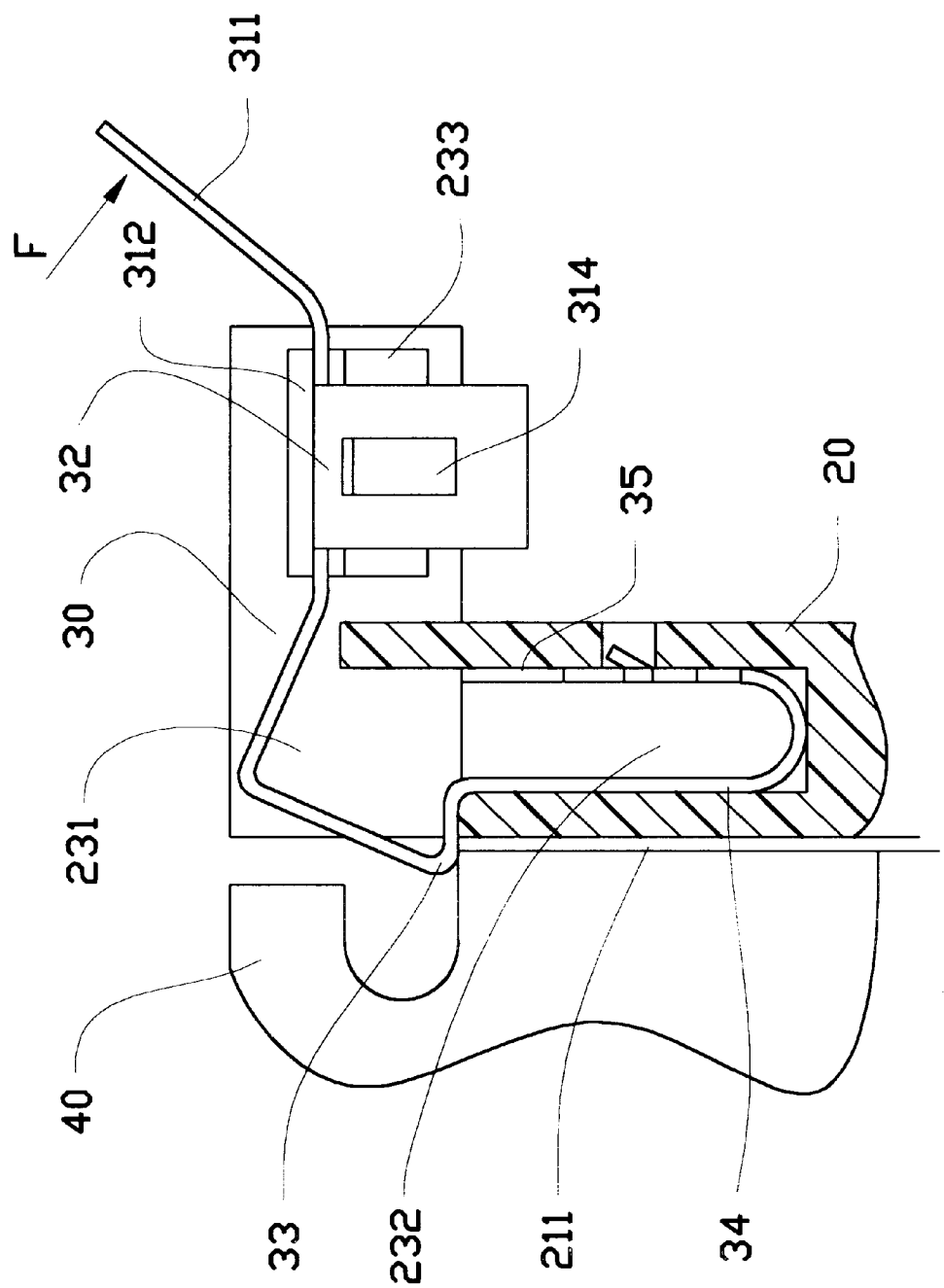
FIG. 8 is a partial cross-sectional view showing that the board retaining means is located in a locking condition with respect to the daughter board.

Therefore, as shown in FIG. 8, when one board retaining means (30) is installed in the cavity portion (23) of the second housing (20), the extensive section (312), the first resilient portion (32) and the latching portion (33) of the board retaining means (30) are approximately received within the horizontal cavity (231) of the cavity portion (23). At the time, the second resilient portion (34) and the retentive portion (35) of the board retaining means (30) are substantially received within the vertical cavity (232) of the cavity portion (23). The operative section (311) of the acting portion (31) is partially exposed to an exterior for providing the user with a manual operation.

Regarding the acting manner of the board retaining means (30), an initial locking position as indicated in FIG. 8. that the latching portion (33) of board retaining means (30) is locking a notch of the inserted daughter board (40) in a vertical direction, wherein the daughter board (40) is restricted in a horizontal direction by said guiding rails (211) in advance. Meanwhile, the first orienting sections (314) of the acting portion (31) can be respectively compressed by the corresponding lateral surfaces of the protrusions (233), so that the first orienting sections (314) can tightly abut against said lateral surfaces to form a close engagement, and the locking position with regard to the inserted daughter board is maintained.

Figure 9:
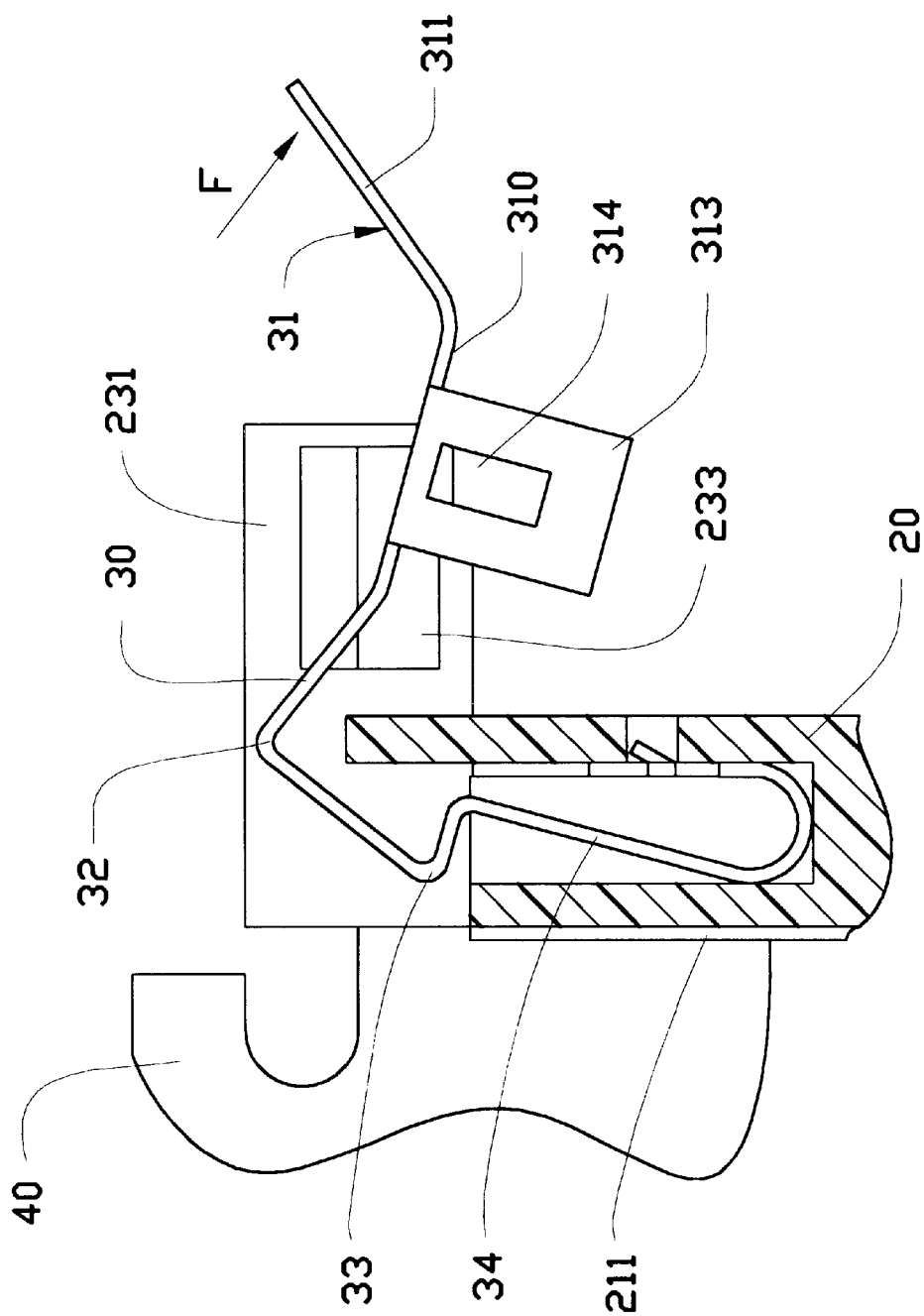
FIG. 9 is a view similar to FIG. 8, but shows that the board retaining means is located in a releasing condition with respect to the daughter board.

Moreover, when the operative section (311) is pressed down along a predetermined direction as indicated by an arrow "F" in FIG. 9 to reach a releasing position with respect to the daughter board (40), most portions including the acting portion (31), the first resilient portion (32) and the second resilient portion (34), generate an elastic deformation. At the same time, the latching portion (33) is forced to move to the inside of the horizontal cavity (231) without locking said notch. Each tab (313) is partially expended to the outside of the horizontal cavity (231), so that the orienting section (314) of each tab (313) can be moved outward to abut upward a bottom surface of a corresponding protrusion (233) for maintaining the releasing position with regard to the daughter board (40). This way, the inserted daughter board (40) can be easily withdrawn from the elongated slot (11) of the first housing (10) along the guiding rails (211) of the second housing (20).

On the other hand, when the tabs (313) are oppositely pressed by another manual operation to engage with each other with their buffer sections (3132), the orienting section (314) of each tab (313) is separated from the bottom surface of the corresponding protrusion (233). Then, by means of the resilience of the first resilient portion (32) and second resilient portion (34), the acting portion (31) can come back the initial locking position. Therefore, in addition to the operative section (311), the tabs (313) are functioned as an operative section that is adapted to provide the user with a manual operation for recovering the locking position with respect to the daughter board.

Figure 10:
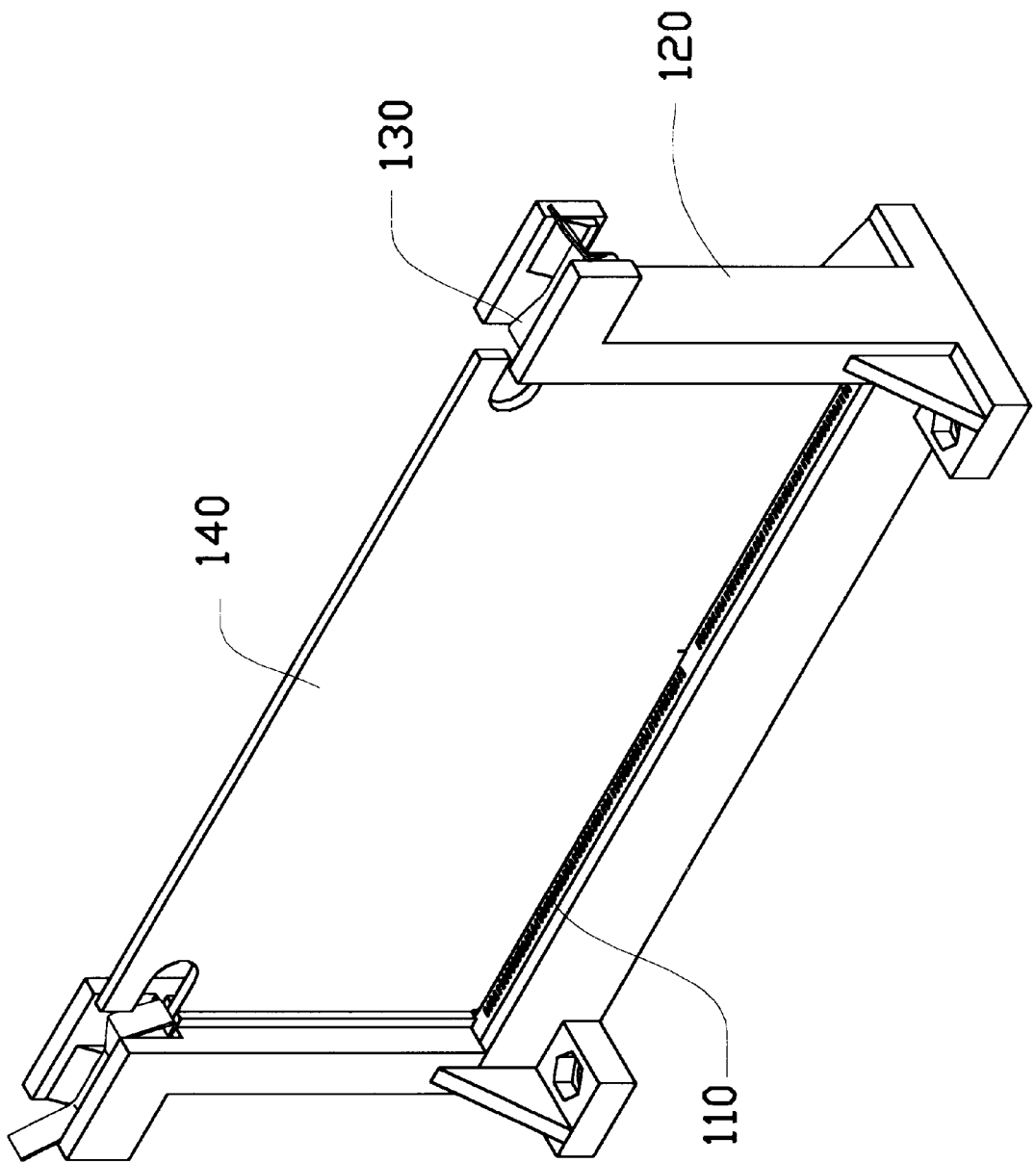
FIG. 10 is a perspective view of an electrical connector according to a second embodiment of the present invention, wherein the connector is inserted with a daughter board.
Figure 11:
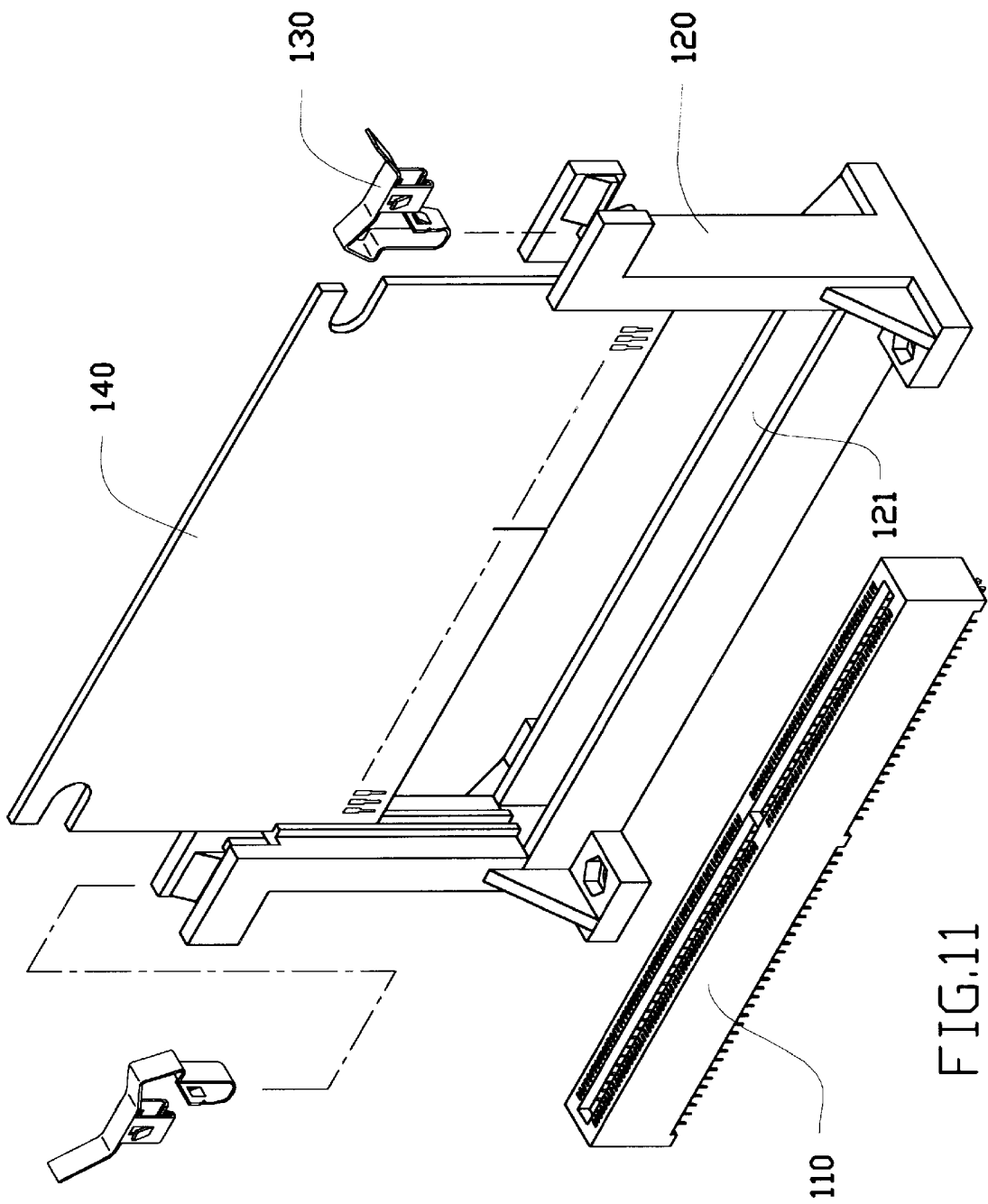
FIG. 11 is an exploded perspective view FIG. 10.

It is noted that in addition to first embodiment of the present invention in which the first housing (10) is integral with second housing (20), a second embodiment of the present invention utilizes a separable conventional edge card connector (110) to replace the integral first housing (10) of the first embodiment. As shown in FIGS. 10 & 11. a second housing (120) of the second embodiment has a hollow portion (121) which is adapted to receive said edge card connector (110) which is mounted on a mother board in advance. As to the retentive structures with regard to the daughter board, the second embodiment is identical with first embodiment.

Certainly, for the convenience of assembly, said edge card connector (110) of the second embodiment can be replaced with another conventional connectors with a different configuration, in accordance with the requirement of the manufacturers.

While the present invention has been described with reference to specific embodiments, the description is illustrative of the invention and is not to be construed as limiting the invention. Various modifications to the present invention can be made to the preferred embodiments by those skilled in the art without departing from the true spirit and cope of the invention as defined by the appended claims.

Therefore, person of ordinary skill in this field are to understand that all such equivalent structures are to be included within the scope of the following claims.

We claim:

1. An electrical connector for electrically connecting a daughter board to a mother board, comprising:

a housing means having an elongated slot with a plurality of contacts for electrically engaging an inserted daughter board, and at least a cavity portion;

a board retaining means received within said cavity portion and integrally forming an operative section for providing a manual operation, and a latching portion removably inserting into a corresponding notch defined in a lateral edge of the inserted daughter board thereby restricting vertical movement of the daughter board, and a retentive portion firmly retained within said cavity portion, and at least a resilient portion for providing the manual operation with a required resilience;

at least an orienting section integrally formed adjacent to the resilient portion, movably incorporating with said cavity portion to retain the latching portion in a locking/releasing position with respect to the inserted daughter board as soon as the manual operation refrains from acting on the operative section.

2. The electrical connector as described in claim 1, wherein said housing means is defined with at least a first housing and a second housing.

3. The electrical connector as described in claim 2, wherein the first housing is integrally with the second housing.

4. The electrical connector as described in claim 1, wherein said cavity portion is defined with a vertical cavity and a horizontal cavity.

5. The electrical connector as described in claim 4, wherein said vertical cavity further forms an hole and a pair of interfering recesses for retentively receiving said retentive portion of the board retaining means.

6. The electrical connector as described in claim 5, wherein said cavity portion further includes at least a protrusion for closely fitting with said orienting section.

7. An electrical connector for electrically connecting a daughter board to a mother board, comprising:

a housing means having an elongated slot with a plurality of contacts for electrically engaging the daughter board, and at least a cavity portion defined therein;

a board retaining means received within said cavity portion and integrally forming an acting portion for providing different manual operations, a latching portion for locking the daughter board, and a retentive portion firmly retained within said cavity portion wherein the acting portion further includes at least a first manual operative means extending outside the cavity portion whereby the latching portion reaches a releasing position which the inserted daughter board can be freely withdrawn, and a second manual operative means extending opposite from said first manual operative means and being incorporated within the cavity portion whereby the latching portion reaches a locking position where the inserted daughter board can be firmly retained in the connector.

8. The electrical connector as described in claim 7, wherein said second manual operative means includes a pair of spaced tabs.

9. The electrical connector as described in claim 8, wherein the pair of tabs respectively and oppositely extend to configure a buffer section.

10. The electrical connector as described in claim 7, wherein the latching portion is located between a first resilient portion and a second resilient portion which provides the manual operation with a required resilience.

11. An electrical connector for electrically connecting a daughter board to a mother board, comprising:

a first housing having an elongated slot with a plurality of contacts for electrically engaging the daughter board;

a second housing having at least a guiding rail for guiding a corresponding edge of the daughter board, and a cavity portion;

a board retaining means received within said cavity portion and integrally forming an acting portion for providing a manual operation, and a latching portion removably inserted into a corresponding notch defined in a lateral edge of the daughter board thereby restricting vertical movement of the daughter board, and a retentive portion firmly retained within said cavity portion, and a first resilient portion for providing the manual operation with a required resilience wherein the cavity portion includes at least a protrusion with different surfaces which the board retaining means movably engages above to respectively retain the latching portion in the cavity portion in a locking/releasing position with respect to the daughter board as soon as the manual operation refrains from acting on the acting portion.

12. The electrical connector as described in claim 11, wherein the cavity portion is defined with a vertical cavity and a horizontal cavity.

13. The electrical connector as described in claim 12, wherein said protrusion is formed on the horizontal cavity.

14. The electrical connector as described in claim 11, wherein said the board retaining means further has a second resilient portion for enhancing the resilience of the whole board retaining means.

15. An electrical connector system for electrically connecting a daughter board to a mother board, comprising:

a first housing having an elongated slot with a plurality of contacts for electrically engaging the daughter board;

at least a second housing having a hollow portion receiving said first housing therein, and at least a supporting portion located at a corresponding end of the second housing and forming thereon a guiding rail adjacent to the hollow portion for vertically guiding the insertion of a corresponding edge of the daughter board, and a cavity portion located above the supporting portion for receiving a corresponding board retaining means which is adapted to lock the daughter board; wherein the board retaining means includes at least an operative section formed at an end thereof for providing a manual operation, and a retentive portion formed at an opposite end for retaining the board retaining means within said cavity portion, and a resilient portion located between said retentive portion and operative section for providing a user with a manually resilient operation.

16. An electrical connector for electrically connecting a daughter board to a mother board, comprising:

a housing means having an elongated slot with a plurality of contacts for electrically engaging the daughter board, and at least a cavity portion which is defined with a vertical cavity and a horizontal cavity perpendicular to the vertical cavity wherein the horizontal cavity forms therein a first surface and a second surface;

a board retaining means received within said cavity portion and integrally forming an operative section extending outside the cavity portion for providing a manual operation, a latching portion for locking the daughter board, and an orienting section adjacent to the operative section, extending into the horizontal cavity for to movably retaining the latching portion at different positions in the cavity portion, and a resilient portion for providing the manual operation with resilience, and a retentive portion firmly retained within said vertical cavity; wherein said latching portion is retained at a locking position with regard to the daughter board without the manual operation acting thereon as soon as the orienting section is closely fitted with the first surface of the horizontal cavity, and said latching portion is retained at a releasing position with regard to the daughter board without the manual operation acting thereon as soon as the orienting section closely fitted with the second surface of the horizontal cavity.

17. The electrical connector as described in claim 16, wherein said orienting section is a hook-like structure.

18. The electrical connector as described in claim 16, wherein said second surface is located below the first surface to define protrusions therein for cooperation with said orienting section.

19. A method of electrically connecting a daughter board to a mother board, comprising:

a housing means having an elongated slot with a plurality of contacts for electrically engaging the daughter board, and at least a cavity portion having at least a protrusion;

a board retaining means received within said cavity portion and at least having an operative section for providing a manual operation, and an orienting section for positioning the operative section, and a resilient portion for providing the manual operation with a resilience, a latching portion for locking the daughter board, and a retentive portion for retaining the board retaining means within said cavity portion; wherein when the operative section not acted on by any manual operation is located in a first position, said orienting section can tightly abut against a surface of the corresponding protrusion to firmly lock with the inserted daughter board, and when the operative section not acted on by any manual operation is located in a second position, said orienting section can tightly abut against another surface of the corresponding protrusion to freely release the inserted daughter board.

* * * * *